(12) United States Patent
Chiu et al.

(10) Patent No.: US 9,154,152 B1
(45) Date of Patent: Oct. 6, 2015

(54) CALIBRATION AND NOISE REDUCTION OF ANALOG TO DIGITAL CONVERTERS

(71) Applicant: MediaTek Inc., Hsin-Chu (TW)

(72) Inventors: Pao-Cheng Chiu, New Taipei (TW); Wei-Hsin Tseng, Shengang Township, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/576,315

(22) Filed: Dec. 19, 2014

Related U.S. Application Data

(60) Provisional application No. 61/952,919, filed on Mar. 14, 2014.

(51) Int. Cl.
| | | |
|---|---|---|
| *H03M 1/06* | (2006.01) | |
| *H03M 1/46* | (2006.01) | |
| *H03M 1/08* | (2006.01) | |
| *H03M 1/20* | (2006.01) | |

(52) U.S. Cl.
CPC ............... *H03M 1/468* (2013.01); *H03M 1/08* (2013.01); *H03M 1/20* (2013.01)

(58) Field of Classification Search
CPC ... H03M 1/468; H03M 1/1038; H03M 1/466; H03M 1/46; H03M 1/1245; H03M 1/00; H03M 2201/3178
USPC .................................. 341/155, 172, 156, 144
See application file for complete search history.

(56) References Cited

U.S. PATENT DOCUMENTS

| | | | |
|---|---|---|---|
| 7,015,841 B2* | 3/2006 | Yoshida et al. ................ | 341/120 |
| 7,199,746 B1* | 4/2007 | Chowdhury et al. .......... | 341/172 |
| 2007/0035434 A1* | 2/2007 | Tachibana et al. ............. | 341/161 |
| 2009/0027251 A1* | 1/2009 | Ohnhauser et al. ........... | 341/158 |
| 2010/0207791 A1* | 8/2010 | Ohnhaeuser et al. ......... | 341/118 |
| 2011/0080925 A1* | 4/2011 | Molina et al. .................. | 370/538 |
| 2011/0215956 A1* | 9/2011 | Ishikawa ........................ | 341/110 |
| 2011/0304490 A1* | 12/2011 | Janakiraman .................. | 341/122 |
| 2012/0218137 A1* | 8/2012 | Yoon et al. ..................... | 341/172 |
| 2012/0286981 A1* | 11/2012 | Satarzadeh et al. ............ | 341/122 |

* cited by examiner

*Primary Examiner* — Jean B Jeanglaude
(74) *Attorney, Agent, or Firm* — McClure, Qualey & Rodack, LLP

(57) ABSTRACT

Analog-to-digital-converters (ADC) are provided. The ADC contains a first capacitive digital-to-analog-converter (CDAC) and a control circuit. The CDAC, including n bit, is configured to connect a kth bit of the n bits to a first voltage reference to provide a first analog signal, convert the first analog signal into first digital code using 0th through (k−1)th bits that are less significant than the kth bit, connect the kth bit of the n bits to a second voltage reference to provide a second analog signal, and convert the second analog signal into second digital code using the 0th through (k−1)th bits that are less significant than the kth bit. The control circuit is configured to estimate a weight of the kth bit based on the first and second digital code.

19 Claims, 11 Drawing Sheets

| K th Step | C13 | C12 | C11 | C10 | C9 | C8 | C7 | C6 | C5 | C4 | C3 | C2 | C1 | C0 |
|---|---|---|---|---|---|---|---|---|---|---|---|---|---|---|
| Cap Weighting w(k) | 1016 | 472 | 256 | 144 | 64 | 40 | 24 | 14 | 7 | 4 | 3 | 2 | 1 | 1 |
| sum | 2048 | 1032 | 560 | 304 | 160 | 96 | 56 | 32 | 18 | 11 | 7 | 4 | 2 | 1 |
| Redundancy q(k) (LSB) | 89.0 | 49.0 | 17.0 | 33.0 | 17.0 | 9.0 | 5.0 | 5.0 | 4.0 | 2.0 | 1.0 | 0.0 | 0.0 | n/a |
| redundancy % | 8.8 | 10.4 | 6.6 | 22.9 | 26.6 | 22.5 | 20.8 | 35.7 | 57.1 | 50.0 | 33.3 | 0.0 | 0.0 | n/a |

CALIBRATION AND NOISE REDUCTION OF ANALOG TO DIGITAL CONVERTERS

CROSS REFERENCE TO RELATED APPLICATIONS

This Application claims priority of U.S. Provisional Application No. 61/952,919, filed on Mar. 14, 2014, and the entirety of which is incorporated by reference herein.

BACKGROUND OF THE INVENTION

1. Field of the Invention

The present invention relates to analog circuits, and in particular to calibration and noise reduction of analog-to-digital converters.

2. Description of the Related Art

A successive-approximation register (SAR) analog-to-digital converter (ADC) is a low-power, high-resolution ADC which converts an analog signal to a corresponding digital representation. ADCs are used in many types of applications, such as but not limited to audio applications, video applications, radio applications, and signal processing applications.

Calibration and noise reduction methods for SAR ADCs are provided to produce high-resolution and accurate digital conversion, without resulting in undesirably large circuit area and power consumption.

BRIEF SUMMARY OF THE INVENTION

A detailed description is given in the following embodiments with reference to the accompanying drawings.

An analog-to-digital-converter (ADC) is disclosed, comprising a first capacitive digital-to-analog-converter (CDAC) and a control circuit. The CDAC, comprising n bits, is configured to connect a kth bit of the n bits to a first voltage reference to provide a first analog signal, convert the first analog signal into first digital code using 0th through (k−1)th bits that are less significant than the kth bit, connect the kth bit of the n bits to a second voltage reference to provide a second analog signal, and convert the second analog signal into second digital code using the 0th through (k−1)th bits that are less significant than the kth bit, wherein k is an integer ranging from 1 to n. The control circuit is configured to estimate a weight of the kth bit based on the first and second digital code.

Another embodiment of an ADC device is provided, comprising a first CDAC and a control circuit. The CDAC, comprising n bit, is configured to connect a kth bit of the n bits to a first voltage reference to provide a first analog signal, inject a first small-signal noise into the first analog signals, and convert the injected first analog signal into first digital code using 0th through (k−1)th bits that are less significant than the kth bit, wherein k is an integer ranging from 1 to n. The control circuit is configured to estimate a weight of the kth bit based on the first digital code.

Another embodiment of an ADC device is described, receiving an analog input signal and outputting digital output data, comprising a clock generator, a sample and hold circuit, a storage circuit, a capacitive digital-to-analog-converter (CDAC) and a comparator, and a control circuit. The clock generator is configured to generate a sampling clock with a sampling period and a conversion period. The sample and hold circuit is configured to sample the analog input signal in a first sampling period to generate a first sampled value, and sample the analog input signal in a subsequent second sampling period to generate a second sampled value. The storage circuit is configured to hold the first sampled value in the subsequent second sampling period. The capacitive digital-to-analog-converter (CDAC) and a comparator are configured to convert the first sampled value into first n-bits digital code in a first conversion period, and perform an analog-to-digital conversion to the first sampled value to regenerate a kth bit of n-bits digital code for a plurality of times in a subsequent second sampling period. The control circuit is configured to determine a kth bit of the digital output data based on the kth bit in the first digital code and the regenerated kth bits.

BRIEF DESCRIPTION OF THE DRAWINGS

The present invention can be more fully understood by reading the subsequent detailed description and examples with references made to the accompanying drawings, wherein:

FIG. 4B is a table of redundancy of the CDAC bits in the S/H and CDAC 42;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention concern with calibration and noise reduction of successive-approximation register (SAR) analog-to-digital converters (ADCs). The name of the SAR ADC comes from that an analog input value is sampled and successively compared with a number of reference levels using a binary search algorithm.

Figure 1:
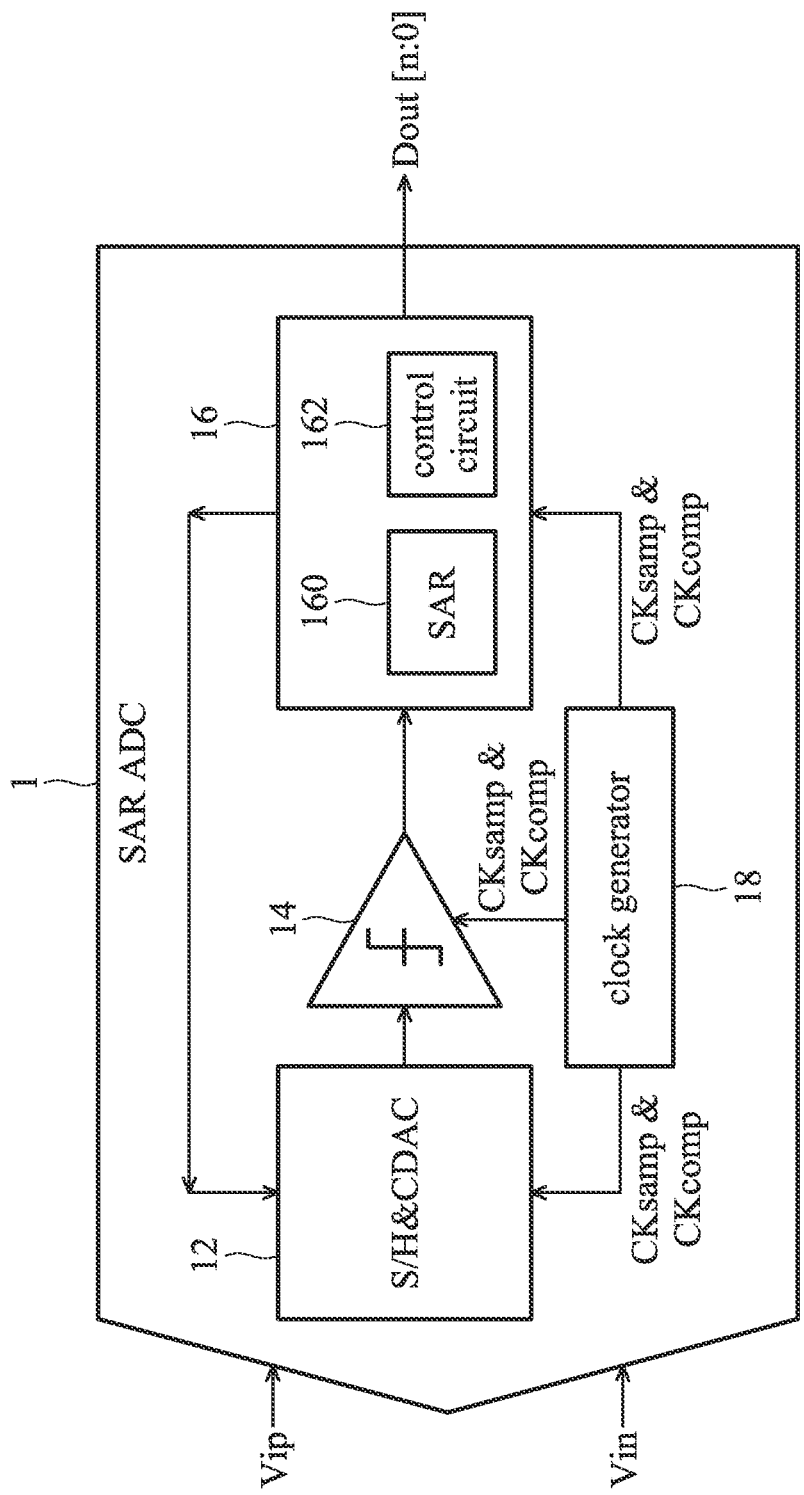
FIG. 1 is a block diagram of an SAR ADC 1.

FIG. 1 is a block diagram of an SAR ADC 1. The SAR ADC 1 contains, a sample-and-hold circuit (SH) and capacitive digital-to-analog-converter (CDAC) 12, a comparator 14, a successive-approximation register (SAR) control circuit 16 and a clock generator 18. The SAR ADC 1 receives differential input signals Vip/Vin and outputs digital code Dout[n:0], wherein the bit n of the outputs digital code Dout[n:0] is the most significant bit (MSB).

In the SAR ADC 1, the analog input signals Vip/Vin are sampled by the SH and CDAC 12 and successively compared with a number of reference levels using a binary search algorithm by the comparator 14 to generate a comparison result sequence to the SAR control circuit 16. The SAR control circuit 16 includes a SAR 160 and a control circuit 162, wherein the SAR 160 stores the comparison result sequence and outputs the comparison result sequence as the digital code Dout[n:0] upon completion of the analog-to-digital conversion, and the control circuit 162 controls normal operations and calibration of the SH and CDAC 12.

Figure 10:
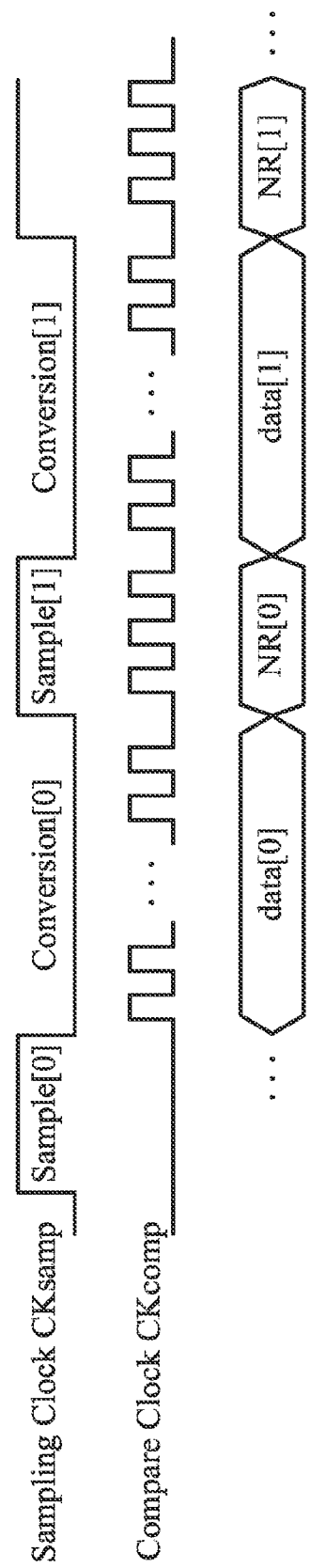
FIG. 10 is a signal diagram of a SAR ADC 10 according to another embodiment of the invention.

The clock generator 18 is an asynchronous clock generator which generates asynchronous clock signals including a sampling clock CKsamp and a compare clock CKcomp. The clock generator 18 supplies the sampling clock CKsamp and compare clock CKcomp to the SH and CDAC 12, comparator 14 and SAR control circuit 16 for operations of the SAR ADC 1. The SAR ADC 1 operates alternately in a sampling phase Psamp and conversion phase Pconv according to the sampling clock CKsamp. In the sampling phase Psamp, SAR ADC 1 samples an analog input according to the compare clock CKcomp. In the conversion phase Pconv, the SAR ADC 1 generates reference voltage levels and converts the sampled analog input with the reference voltage levels according to the compare clock CKcomp. FIG. 10 shows waveforms of the sampling clock CKsamp and a compare clock CKcomp.

A conversion sequence using the binary search algorithm is described as follows. Each conversion cycle includes a DAC phase and a comparison phase. In the beginning of the conversion sequence, all bits of the SH and CDAC 12 are reset to Binary '0'.

In the first DAC cycle, the SAR control circuit 16 can switch the most significant bit (MSB) of the SH and CDAC 12 to Binary '1' and the other bits less significant than the MSB capacitor 100a are set to Binary '0', resulting in an reference voltage level at the output of the SH and CDAC 12 equal to one-half of the full-scale range of the SH and CDAC 12. In the comparison phase, the comparator 14 compares the input difference (Vip-Vin) with the reference voltage level to generate a comparison result. If the input difference (Vip-Vin) is greater than the reference voltage level, the comparator output is set to Binary '1' and stored in the MSB of the SAR 160, otherwise, the comparator output is set to Binary '0' and stored in the MSB of the SAR 160.

In the next DAC cycle, the MSB and the second MSB of the SH and CDAC 12 are set to Binary '1' to the second reference voltage Vgnd and the other bits less significant than the second MSB capacitor 100b are set to Binary '0', and the reference voltage level output from the SH and CDAC 12 will now be one-half plus one-quarter of the full-scale range of the SH and CDAC 12. If the input difference (Vip-Vin) is greater than the reference voltage level, the comparison result continues to set the second MSB of the SAR 160 to Binary '1', otherwise, the second MSB of the SAR 160 is set to Binary '0'.

In the next DAC phase, the next binary-weighted voltage will be added by the SH and CDAC 12 to the previous reference voltage level to serve as the reference voltage level. The compactor 14 will set a corresponding SAR bit of the SAR 160 to Binary '1' when the input value exceeds the reference voltage level output from the SH and CDAC 12, and Binary '0' when the input value is less than the reference voltage level. The successive approximation continues until all bits are tested and the closest approximation is obtained. The result is that the SAR 16 outputs the digital code Dout[n: 0] that are either set to Binary '1' or '0' depending on the comparison results of the output of the SH and CDAC 12 and the input difference value (Vip-Vin).

Accordingly, the SH and CDAC 12 plays a crucial part in generating the reference voltage levels for converting the input difference (Vip-Vin) to the digital outputs Dout[n: 0] accurately. As the SH and CDAC 12 is often implemented by a capacitor bank which contains a large number of binary-weighted capacitors, i.e., each CDAC capacitor has a capacitance that is exactly twice the value of the next smaller CDAC capacitor. In high-resolution ADCs such as a 14-bit SAR ADC, the variation range of the capacitances of the CDAC capacitors are too wide to be realized in an economically feasible size while maintaining satisfactory capacitance mismatch.

Therefore, the SH and CDAC 12 is required to be calibrated to determine a correct weight or capacitance for each CDAC capacitor in the capacitor bank. During calibration, the correct weight or capacitance of each CDAC capacitor is estimated and stored. Later in an ADC operation, the estimated weights are provided to produce a compensated digital output Dout[n: 0]. The calibration process may be illustrated by an SAR ADC 2 in FIG. 2.

Figure 2:
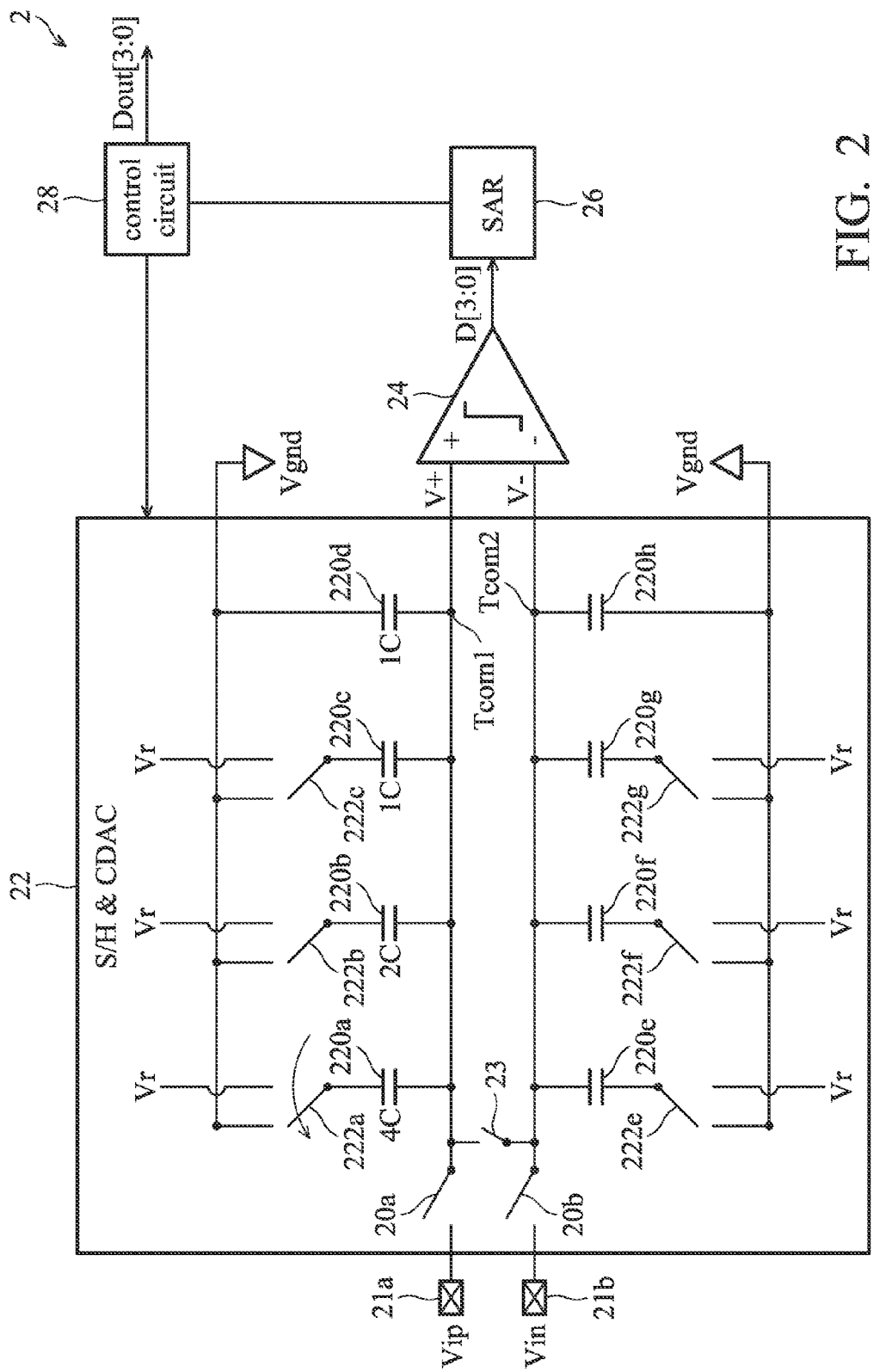
FIG. 2 is a schematic circuit diagram of an SAR ADC 2 according to an embodiment of the invention.

FIG. 2 is a schematic circuit diagram of a 4-bit, fully-differential SAR ADC 2 according to an embodiment of the invention. The SAR ADC 2 contains input nodes 21a and 21b, sampling switches 20a and 20b, a reset switch 23, a sample and hold circuit (S/H) and capacitive digital-to-analog-converter (CDAC) 22, a comparator 24, a successive-approximation register (SAR) 26, and a control circuit 28. The differential input signals Vip/Vin may be respectively applied at the input nodes 21a and 21b during the ADC operation.

The S/H and CDAC 22 is a 4-bit capacitor bank with binary-weighted capacitances, wherein each pair of the same binary-weighted capacitor represents a CDAC bit. Specifically, the S/H and CDAC 22 contains upper and lower capacitor banks, the upper capacitor bank includes capacitors 220a through 220d and the lower capacitor bank includes capacitors 220e through 220h. The capacitors 220a through 220d have binary-weighted capacitances of 4 C, 2 C, 1 C, and 1 C, respectively, where C is a common capacitance unit. Likewise, the capacitors 220e through 220h have binary-weighted capacitances of 4 C, 2 C, 1 C, and 1 C. Each capacitor in the S/H and CDAC 22 may be connected to a first reference voltage Vr or second reference voltage Vgnd via a corresponding capacitor switch. Capacitor switches 222a through 222c and 222e through 222g in the DAC 22 may connect the capacitors 220a through 220h to the first reference voltage Vr or second reference voltage Vgnd, respectively. Since the SAR ADC 2 is fully differential, the operations of the two capacitors of the same CDAC bit are complementary in the conversion phase. More specifically, in the conversion phase, when one capacitor of the same CDAC bit is connected to the second reference voltage Vgnd, the corresponding capacitor of the same CDAC bit is connected to the first reference voltage Vr, and vice versa.

The S/H and CDAC 22 adopts a top-plate sampling circuit configuration, where the differential input signals Vip/Vin are sampled by the top plates of the capacitors and the bottom plate of the capacitors are reset to the reference voltage Vr. Moreover, the S/H and CDAC 22 adopts a monotonic switching procedure, where the capacitor switches 222a through 222c and 222e through 222g are initially reset to the first reference voltage Vr and then successively switch one of the capacitor switches 222a through 222c and 222e through 222g from the first reference voltage Vr to the second reference voltage Vgnd to generate the reference voltage levels based on the comparison results. When the comparison result is Binary '1', one of the capacitor switches 222a through 222c in the upper capacitor bank is switched to the second reference voltage Vgnd to generate the next reference voltage level; when the comparison result is Binary '0', one of the capacitor switches 222e through 222g in the lower capacitor bank is switched to the second reference voltage Vgnd to generate the next reference voltage level.

The switching sequence may progress from the MSB to the LSB of the S/H and CDAC 22. Typically, after being switched from the first reference voltage Vr to the second reference voltage Vgnd, each switching operation requires a finite settling time for the switched CDAC bit to settle within the resolution of the S/H and CDAC 22, for example, ½ LSB of the DAC 12. As the switched CDAC bits proceed from the MSB to LSB, the settling time for the switched CDAC bit is decreased. This circuit configuration of the S/H and CDAC 22 allows a decreased number of switching and a decreased length of the settling time for generating the reference voltage levels.

The capacitor bank in the S/H and CDAC 22 may contain capacitance mismatches or errors, causing the binary-weighted capacitors 220a through 220h not being the expected value that is exactly twice the capacitance of the next smaller CDAC capacitor. A calibration process can be adopted to compensate for the capacitance mismatches, as detailed by various embodiments of the invention.

The comparator 24 compares the input difference (Vip−Vin) with the successively generated reference voltage levels to approximate the digital conversion of the differential signals Vip/Vin. The comparator 24 may contain circuit deficiencies such as comparator offset and comparator noise. The circuit deficiencies can be removed by the calibration process and noise reduction process described in the embodiments of the invention.

The SAR 26 contains registers which accepts the comparison results of the comparator 24 and holds the digital approximation of the sampled analog input. The resultant code of the digital approximation of the sampled analog input may be output as the 4-bit digital output Dout[3:0] at the end of the conversion phase. The time to convert the input analog voltage to digital output is 3 clock cycles. The 4-bit digital output Dout[3:0] can be taken in parallel or shifted out as each comparison is made.

The control circuit 28 controls the input nodes 21a and 21b, sampling switches 20a and 20b, reset switch 23, S/H and CDAC 22, comparator 24 and SAR 26 to perform the circuit calibration and the sampling and conversion operations.

The calibration process may be initiated in a manufacturing test or performed automatically on power-up. In one embodiment, the calibration process may compensate for the capacitance mismatch in the S/H and CDAC 22 and remove the comparator offset in the comparator 24, so that the SAR ADC 2 may output the digital approximation of the sampled analog input to match the ideal levels of the weights of the CDAC bits.

In the calibration, the CDAC capacitors 220a through 220h are initially reset by disconnecting the sampling switches 20a and 20b from the input nodes 21a and 21b, and switching the capacitor switches 222a through 222c and 222e through 222g to the first reference voltage Vr. Further, the reset switch 23 is closed and then opened again to bring the common terminals Tcom1 and Tcom2 of the capacitors 220a through 220d and capacitors 220e through 220h to a common voltage potential.

The calibration may starts from the MSB down or the second LSB up. For the purpose of explanation, the following will use the top-down approach to illustrate the detailed operations of the calibration procedure.

The MSB of the S/H and CDAC 22 has a weight W[3] which can be determined by finding the difference between the MSB of the S/H and CDAC 22 being Binary '1' and Binary '0', wherein the MSB of the S/H and CDAC 22 being Binary '1' or Binary '0' is approximated by the other CDAC bits that are less significant than the MSB and represented by $D_1[2:0]$ and $D_0[2:0]$, respectively. Because the digital approximations $D_1[2:0]$ and $D_0[2:0]$ are produced by the S/H and CDAC 22 and the comparator 24, they contain information of the MSB of the S/H and CDAC 22 being Binary '1' or Binary '0' and a comparator offset Voffset in the comparator 24. By obtaining the difference between the digital representations $D_1[2:0]$ and $D_0[2:0]$, the comparator offset Voffset in the comparator 24 can be removed, and the remaining information about the MSB of the S/H and CDAC 22 being Binary '1' or Binary '0' can be used to estimate the weight W[3].

Figure 3:
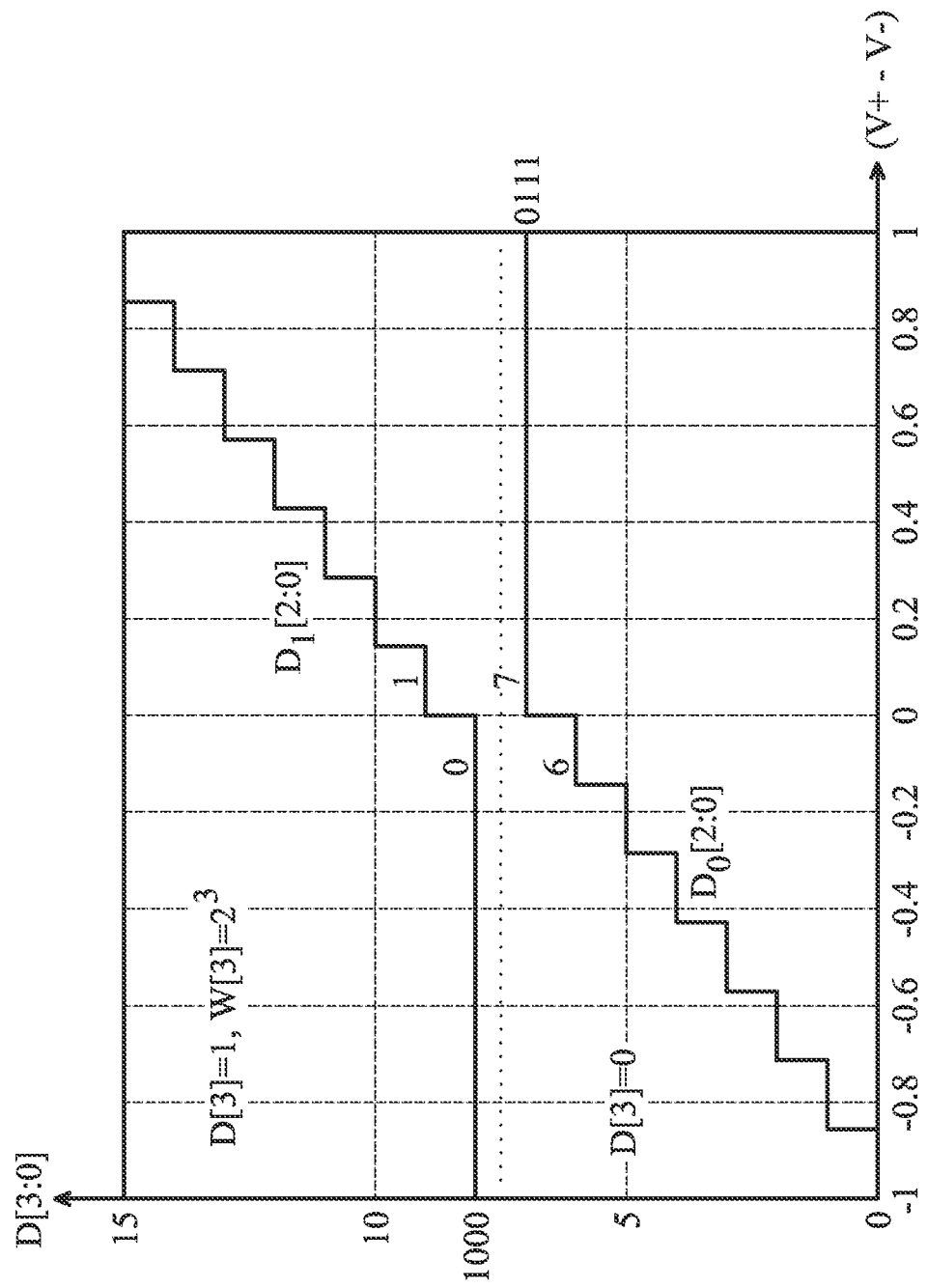
FIG. 3 shows line diagrams of the output bits Dout[2:0] for the MSB Dout[3] of the SAR ADC 1 being 1 and 0.

FIG. 3. shows line diagrams of the comparator output bits Dout[2:0] for the MSB of the comparator 24 D[3] being 1 and 0, where the x-axis is the voltage difference of the inverting and non-inverting inputs of the comparator 24, and the y-axis is the digital representation of the input voltage difference of the comparator 24.

Returning to FIG. 2, to begin with the estimation of the weight W[3], the MSB of the comparator output D[3] of the comparator 24 or the MSB of the S/H and CDAC 22 is forced to Binary '1' by connecting the capacitor switch 222a to the first reference voltage Vr and switching the capacitor switch 222e from the first reference voltage Vr to the second reference voltage Vgnd, the other capacitor switches 222b, 222c, 222f and 222g remain connected to the first reference voltage Vr. As a result, an analog voltage $V_{3\_b1}$ representing that the MSB of the S/H and CDAC 22 is Binary '1' is present across the non-inverting and inverting inputs of the comparator 14. Subsequently, the control circuit 28 can determine the digital representation $D_1[2:0]$ of the analog voltage $V_{3\_b1}$ in terms of the CDAC bits that are less significant than the MSB of the S/H and CDAC 22 using a binary search algorithm. Accordingly, the binary weights of the upper or lower capacitor banks are 4 C, 2 C, 1 C, 1 C in an ideal condition, and consequently, the analog voltage $V_{3\_b1}$ can be approximated by the lower 3 CDAC bits as Binary '111' and saved as $D_1[2:0]$ in the SAR 26. In practice, the weights of the upper or lower capacitor banks may slightly deviate from the ideal values, one example may be 4.1 C, 2.1 C, 0.9 C, 0.9 C. In the condition as such, the analog voltage $V_{3\_b1}$ may still be estimated by all the lower 3 CDAC bits so long as a sum of the weights of the lower 3 CDAC bits equals or exceeds the weight W[3]. In the example, the digital representation of the analog voltage $V_{3\_b1}$ is still approximated as Binary '111'.

To reduce or remove the comparator offset Voffset from the estimated digital representation of the weight W[3], another ADC operation is performed for the MSB of the S/H and CDAC 22. The second ADC is performed by forcing the MSB Dout[3] of the comparator 24 or the MSB of the S/H and CDAC 22 to Binary '0'. More specifically, the capacitor switch 222a is switched to the second reference voltage Vgnd and the capacitor switch 222e is switched to the first reference voltage Vr, and the other capacitor switches 222b, 222c, 222f and 222g remain connected to the first reference voltage Vr. Consequently, an analog voltage $V_{3\_b0}$ representing that the MSB of the S/H and CDAC 22 is Binary '0' is present across the non-inverting and inverting inputs of the comparator 14. Subsequently, the control circuit 28 can determine the digital representation $D_0[2:0]$ of the analog voltage $V_{3\_b0}$ in terms of the CDAC bits that are less significant than the MSB of the S/H and CDAC 22 using a binary search algorithm. The analog voltage $V_{3\_b0}$ may be approximated by the lower 3 CDAC bits as Binary '000' and saved as $D_0[2:0]$ in the SAR 26.

The control circuit 28 then determines the weight W[3] of the MSB of the S/H and CDAC 22 by subtracting the comparator outputs $D_0[2:0]$ from $D_1[2:0]$, and store the subtraction result ($D_0[2:0]-D_1[2:0]$) as weight W[3] of the MSB of the S/H and CDAC 22 in the SAR 26 or other internal memory cells.

Following the above calibration procedure, the SAR ADC 2 carries on to estimate the remaining weights W[2] and W[1] for the less significant CDAC bits and stores the estimated weights W[2] and W[1] for the $2^{nd}$ and $3^{rd}$ CDAC bits of the S/H and CDAC 22. The weight W[0] of the LSB of the S/H and CDAC 22 may be set as Binary '1' by default.

At the end of the calibration procedure, the SAR ADC 2 holds the estimated weights of all CDAC bits in the SAR 26 or other internal memory cells. In the normal ADC operation, the SAR ADC 2 converts the sampled input value by successive approximation until all bits are tested and the digital approximation D[3:0] is generated. The control circuit 28 can calibrate the digital approximation D[3:0] with the estimated weights W[3] through W[0] by multiplying the each bit of the digital approximation D[k] with the corresponding estimated weight W[k] and summing all products together to output as the compensated digital code Dout[3:0], where k is an integer value ranging from 0 to 3. In some embodiments, the control circuit 28 may encode the compensated digital code Dout[3:0].

Although the embodiment in FIG. 2 employs a top-plate sampling, monotonic capacitor switching, binary search type of SAR ADC to illustrate the operations of the CDAC weight calibration procedure, those skilled in the art can modify the present teaching to be adopted by other SAR ADC embodiments. For example, the weight calibration procedure can be adopted by a redundant SAR ADC, where redundant bits are employed to increase the tolerance of the comparator offset and correct transient errors caused by reference voltage levels that are not settled within a specified settling time.

The SAR ADC 1 toggles each bit in the S/H and CDAC circuit and use the remaining less significant bits to estimate the correct weight of the toggled bit, thereby delivering accurate output digital codes.

Figure 4A:
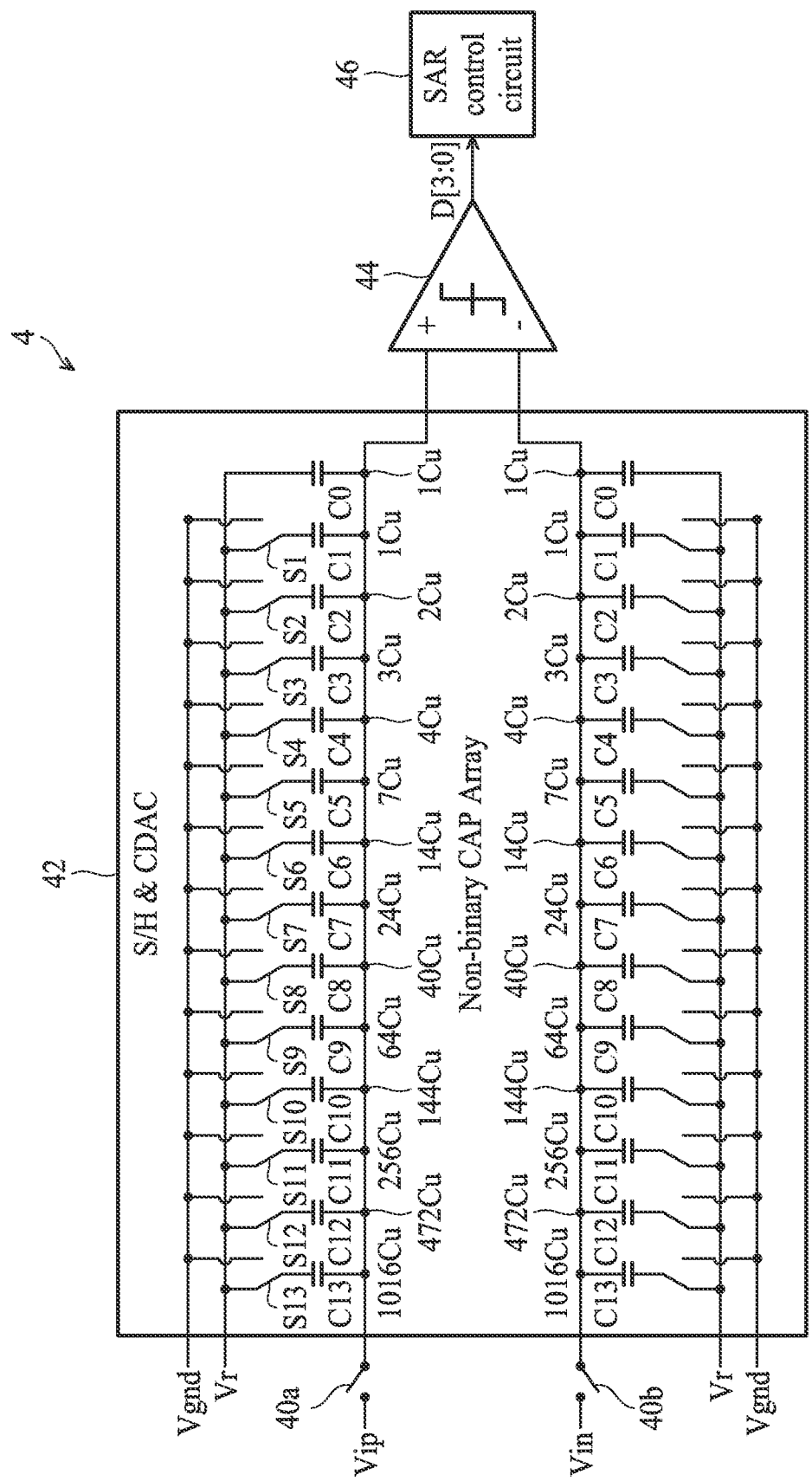
FIG. 4A is a schematic circuit diagram of a 14-bit redundant SAR ADC 4 according to an embodiment of the invention.

FIG. 4A is a schematic circuit diagram of a 14-bit redundant SAR ADC 4 according to an embodiment of the invention, including sampling switches 40a and 40b, a S/H and CDAC 42, a comparator 44, and a SAR control circuit 46.

The redundant SAR ADC 4 employs a non-binary successive approximation algorithm to increase conversion speed while relaxing the settling requirements. The non-binary successive approximation algorithm adopted by the SAR ADC 4 has a reduced searching radix that is less than 2. The complete SAR conversion requires 15 clocks of the conversion cycles to achieve a nominal resolution of 12-bit. The redundancy of the non-binary algorithm is a measure of ability of correcting comparison errors caused by unsettled reference voltage levels. A positive redundancy represents that the comparison error made at the present conversion cycle can be corrected by the successive conversion cycles, at the expanse of extended total conversion cycles.

The redundancy q(k) at the kth conversion is the sum of weights of the bits switched from the (k+2)th to Mth conversion minus the weight W[k+1] of the bit at the (k+1)th conversion and then plus the LSB weight (a quantization step), expressed as:

$$q(k) = -W[k+1] + \sum_{i=k+2}^{M} W[i] + 1 \quad \text{Eq. [1]}$$

where k is a count of DAC step performed by the S/H and CDAC 42; and

M is the total conversion cycles, exceeding a total number of ADC bits N of the SAR ADC 4.

The redundancy q(k) is configured to exceed 0 to provide increased ability of correcting the conversion errors and relax DAC settling time of the S/H and CDAC 42, resulting in faster ADC than that in the binary search.

Figure 5:
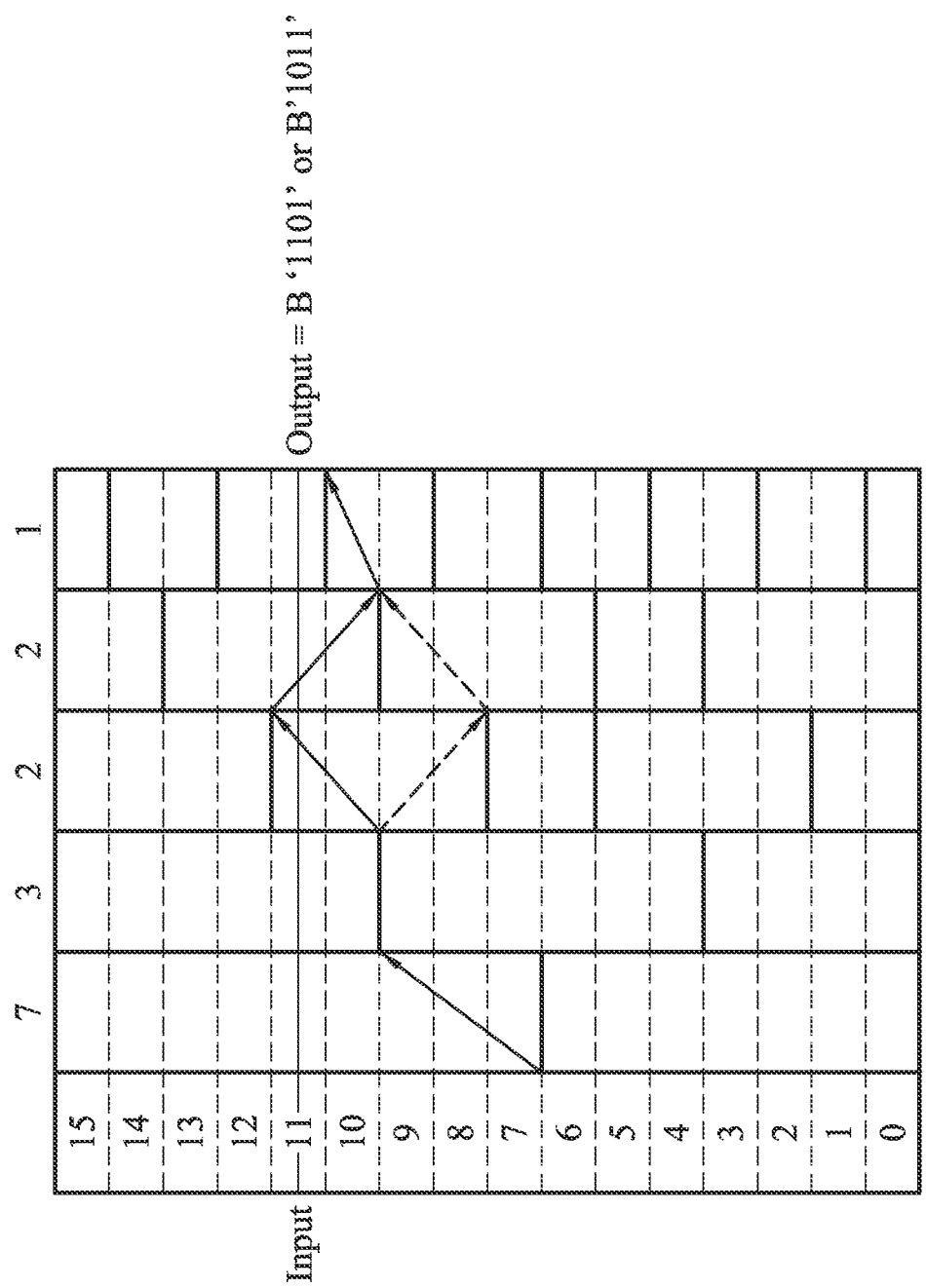
FIG. 5 shows operations of a redundant SAR ADC.

The concept of redundancies in a SAR ADC is further detailed in FIG. 5. An input analog signal is converted into a 4-bit digital output D[3:0], with the weights from the MSB to the second LSB being 7, 3, 2, 2 bit weight units and the range of conversion being 15 bit weight units. The LSB is a dummy bit.

Without comparator offsets, or with negligible comparator offsets, the conversion process can be performed as follows. The input analog signal is an analog value representative between the 11th and 12th bit weight unit. In the first conversion cycle, a comparator compares the input analog signal with a first reference voltage level of 7 bit weight units and generates the first comparison result as Binary '1' since the input analog signal exceeds the first reference voltage level.

In the second conversion cycle, the CDAC generates a second reference voltage level of (7+3) bit weight units. However, because the second reference voltage level takes a longer time to settle at 10 bit weight units than the specified settling time, the comparator may or may not use the correct second reference voltage level of 10 bit weight units for comparison. In the first case, the comparator compares the input analog signal with the correct second reference voltage level of 10 bit weight units and generates the second comparison result as Binary '1'. In the second case, the comparator compares the input analog signal with an incorrect second reference voltage level exceeding 12 bit weight units and generates the second comparison result as Binary '0'.

In the subsequent third and fourth comparison cycles, for the first case, the comparator successively compares the input analog signal with 12 and 10 bit weight units and generates the third and fourth comparison results as Binary '0' and Binary '1', respectively. The digital output D[3:0] in the first comparison case is Binary '1101', or '11' in decimal digits. In the second case, the comparator successively compares the input analog signal with 8 and 10 bit weight units and generates the third and fourth comparison results as Binary '1' and Binary '1', respectively. The digital output D[3:0] in the second case is Binary '1011', or '11' in decimal digits, the same decimal result as in the first case.

By employing the redundancies, the redundant SAR ADC is able to correct the final digital output at the last two bits, even though a comparison error occurs in the second step for the second case.

Returning to FIG. 4A, the calibration process performed by the SAR ADC 2 may be adopted by the redundant SAR ADC 4.

The calibration process may be initiated in a manufacturing test or performed automatically on power-up to compensate for the capacitance mismatch in the S/H and CDAC 42 and remove the comparator offset in the comparator 44, so that the redundant SAR ADC 4 may output the digital approximation of the sampled analog input to match the ideal levels of the weights of the CDAC bits.

In the calibration, the CDAC capacitors C0 through C13 are initially reset by disconnecting the sampling switches 40a and 40b from the input signals Vip and Vin, and switching the capacitor switches 51 through S13 to the first reference voltage Vr. Further, the common terminals Tcom1 and Tcom2 of the capacitors in the upper and lower capacitor banks may be shorted to be initiated at a common voltage potential.

According to Equation Eq. [1], the positive redundancy q(k) of the non-binary SAR algorithm can be obtained when W[k+1]<W[k+2]+W[k+3]+ ... +W[M]+1. That is, in the redundant SAR ADC 4, the weight of a kth bit in the 14 CDAC bits is less than the summation of the weights of all remaining less significant bits plus 1. Therefore, the kth bit can always be represented by the CDAC bits that are less significant than the kth bit in the calibration process. FIG. 4B is a table of redundancy of the CDAC bits in the S/H and CDAC 42. The weight W[k] of the CDAC bit in the kth step is carefully selected such that it exceeds the weight W[k+1] of the next CDAC bit and is less than the summation of all weights of the less significant CDAC bits. For example, the CDAC bit C12 has a weight 472 C which exceeds the weight 256 C of the CDAC bit C11 and is less than the sum of the weights of all less significant CDAC bits, which is added up to 560 C. The redundancy of the CDAC bit C13 is calculated by subtracting the weight of the CDAC bit C12 (472 C) from the sum of weights of all CDAC bits less significant than the CDAC bit C12 (560 C) and then adding 1 C, amounting to 89 C.

The SAR control circuit 46 can direct the calibration process for the SAR ADC 4 as outlined below.

The MSB of the S/H and CDAC 42 has an ideal weight of 1016 C. The actual weight $W_{MSB}$ of the MSB can be estimated by the calibration process. In the calibration process, the capacitor switch S13 is switched to the second reference voltage Vgnd to connect the MSB to the second reference voltage Vgnd and place a weight voltage $V_{MSB1}$ representative of the weight $W_{MSB}$ of the MSB on the non-inverting input terminal of the comparator 44. The CDAC bits C12 through C0, which are less significant than the MSB, are operated in sequence to generate 13 reference voltage levels to track the weight voltage $V_{MSB1}$ and produce a first digital code $D_1[12:0]$. The capacitor switch S13 is then switched to the first reference voltage Vr to connect the MSB to the first reference voltage Vr and place a weight voltage $V_{MSB0}$ representative of the MSB being Binary '0' on the non-inverting input terminal of the comparator 44. The CDAC bits C12 through C0 are again operated in sequence to generate 13 reference voltage levels to track the weight voltage $V_{MSB0}$ and produce a second digital code $D_0[12:0]$. The first and second digital codes $D_1[12:0]$, $D_0[12:0]$ may be stored in local memory cells (not shown) in the SAR control circuit 46. Since the second digital code $D_0[12:0]$ is generated by the comparator 44 when the MSB is Binary '0', it contains only the digital approximation of the comparator offset in the comparator 44. The SAR control circuit 46 can load the first and second digital codes $D_1[12:0]$, $D_0[12:0]$ and estimate the actual weight $W_{MSB}$ of the MSB by subtracting the first digital code $D_1[12:0]$ from the first second code $D_0[12:0]$, i.e., by removing the comparator offset from the digital approximation of the weight $D_1[12:0]$, thereby determining the estimated weight $W_{MSB}$ of the MSB.

The SAR control circuit 46 may store the estimated weight $W_{MSB}$ of the MSB in the local memory cell, and proceeds to determine the weight Wk for the remaining CDAC bits according to the calibration procedure described above, where k is an integer ranging between 1 and 12. At the end of the calibration, the SAR control circuit 46 contains the estimated weights W13 through W1 and the default weight W0. The estimated weights can be used to calibrate the normal ADC operation result by the following expression:

$$Dout[13:0] = \sum_{k=0}^{13} D[k]W[k] \quad \text{Eq. [2]}$$

The redundant SAR ADC 4 toggles each bit in the S/H and CDAC circuit and use the remaining less significant bits to estimate the correct weight of the toggled bit, thereby delivering accurate output digital codes.

Figure 6:
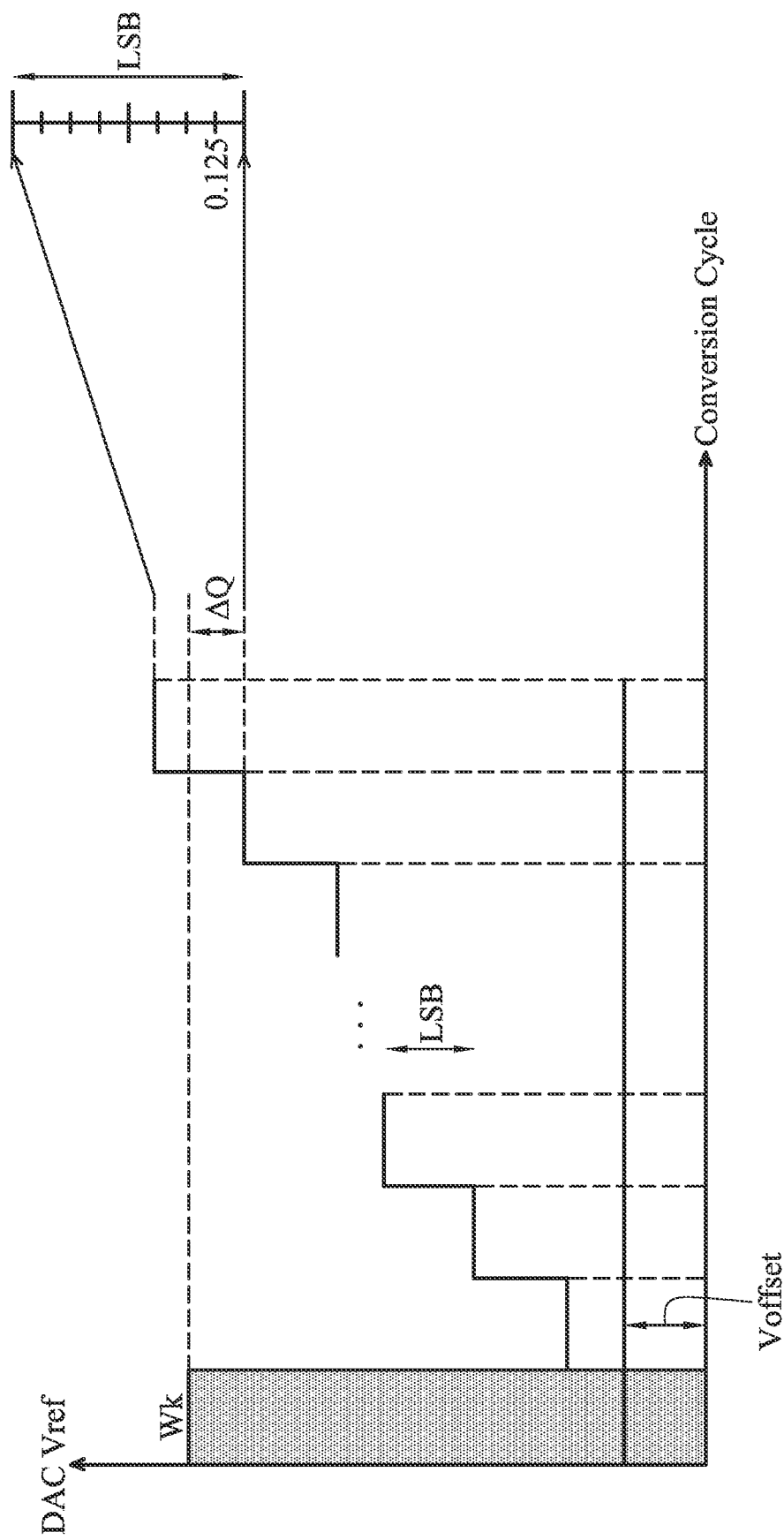
FIG. 6 illustrates a calibration method 6 for an SAR ADC using extra quantization bits according to an embodiment of the invention.

FIG. 6 illustrates a calibration procedure 6 for an SAR ADC using extra quantization bits according to an embodiment of the invention, incorporating the SAR ADC in FIG. 4. The leftmost solid bar shows the weight Wk of the kth CDAC bit, and the right curve illustrates stepwise quantization values of a sum of weights of the CDAC bits that are less significant than the kth CDAC bit. The calibration procedure 6 adopts quantization bits to increase the data convergence speed in the calibration.

During the calibration process, the weight Wk of the kth CDAC bit is tracked by the CDAC bits that are less significant than the kth CDAC bit to generate a digital code D[(k−1):0] best matching to the weight Wk. As in the redundant SAR ADC 4, the weight Wk of the kth bit in the is less than the sum of the weights of all remaining less significant bits plus 1, the weight Wk can always be tracked or represented by the CDAC bits [(k−1):0], provided that the comparator offset Voffset is zero or negligently small. When the comparator offset Voffset is relatively large, the calibration range for the weight Wk will be reduced to the sum of the weights of all remaining less significant bits minus the comparator offset Voffset. Moreover, a quantization error ΔQ due to the capacitance mismatch or comparator offset may be present in the weight Wk, causing slow convergence in the digital conversion. Specifically, the weight Wk of the kth CDAC bit in the S/H and CDAC 42 can be expressed as:

$$Wk = \sum_{i=1}^{k-1} D[i]W[i] + \Delta Q \quad \text{Eq. [3]}$$

In the embodiment, a plurality of quantization bits (not shown) are incorporated into the S/H and CDAC 42 to speed up the data convergence during the weight estimation. The resolution of the newly added quantization bits is less than that of the CDAC bit. In one embodiment, three quantization bits are included in the S/H and CDAC 42, with a resolution of ⅛ LSB of the original 14 CDAC bits. In the calibration, the three quantization bits are used to approximate or estimate the quantization error ΔQ in the weight Wk, leading to an increased speed of the data convergence in estimating the weight Wk.

Figure 7:
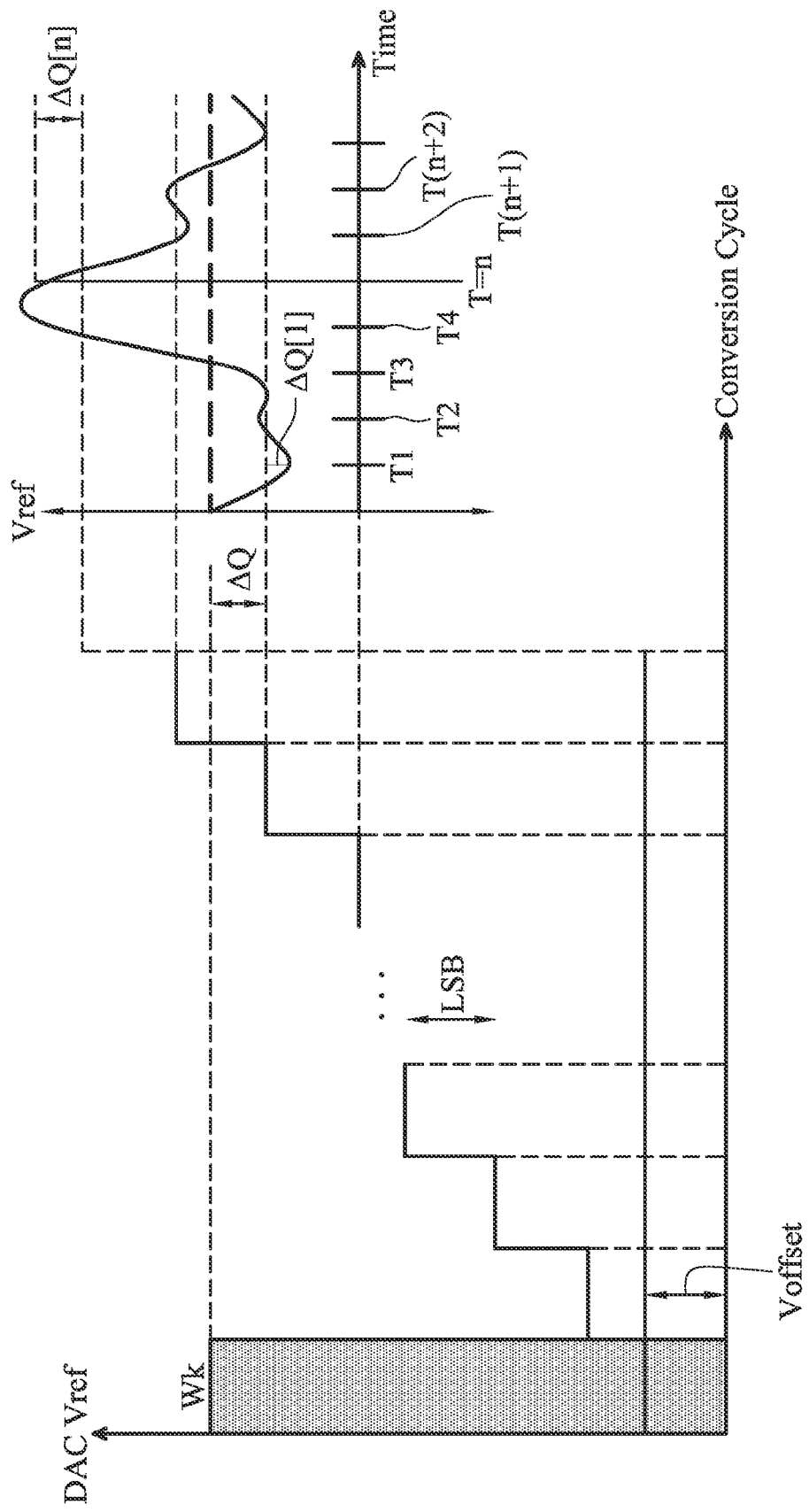
FIG. 7 illustrates a calibration method 7 for an SAR ADC using a small signal noise S[n] according to an embodiment of the invention.

FIG. 7 illustrates a calibration procedure 7 for an SAR ADC using a small signal noise S[n] according to an embodiment of the invention, incorporating the SAR ADC in FIG. 4. The left part of FIG. 7 is identical to FIG. 6, the right part shows the weight value Wk' after a small-signal, zero-average noise S[n] has been injected into the weight Wk of the kth CDAC bit. The calibration procedure 7 adopts the small-signal noise S[n] to achieve a zero-average quantization error ΔQ in the weight Wk. The calibration procedure 7 may not be used in conjunction with the quantization bits of the calibration procedure 6.

In the embodiment, the S/H and CDAC 42 injects the small-signal, zero-average noise S[n] into the weight Wk of the kth CDAC bit in order to spread the quantization error ΔQ over time, resulting in an averaged quantization error ΔQ substantially equaling 0. The small-signal noise S[n] is independent of the quantization error ΔQ, and may be an intrinsic thermal noise of the SAR ADC. In some embodiments, the small-signal noise S[n] is obtained from the intrinsic thermal noise present in the comparator currents of the comparator 44. The variation of the small-signal noise S[n] is within a limited range, e.g., 2 LSBs, so that the estimation of the weight Wk' will converge in a reduced period of time.

The injected weight Wk' can be expressed as follows:

$$Wk' = S[n] + \sum_{i=1}^{k-1} D_i[n]W[i] + \Delta Q[n] \qquad \text{Eq. [4]}$$

The added small-signal noise S[n] will dominate the distribution of the quantization error ΔQ, causing the quantization error ΔQ to converge toward zero over time.

Referring to the right part of the FIG. 7, it can be seem that after the small-signal noise S [n] is injected, the quantization error ΔQ is spread out over time. At Times Ti through T(n+2), the quantization errors ΔQ[1] through ΔQ[n+2] varies randomly on both sides of the quantization levels. The values of the quantization errors ΔQ[1] through ΔQ[n+2] are evened out to a zero average when the comparator 44 compares the injected weight Wk' with the reference voltage levels output from the SH and CDAC 42.

Figure 8:
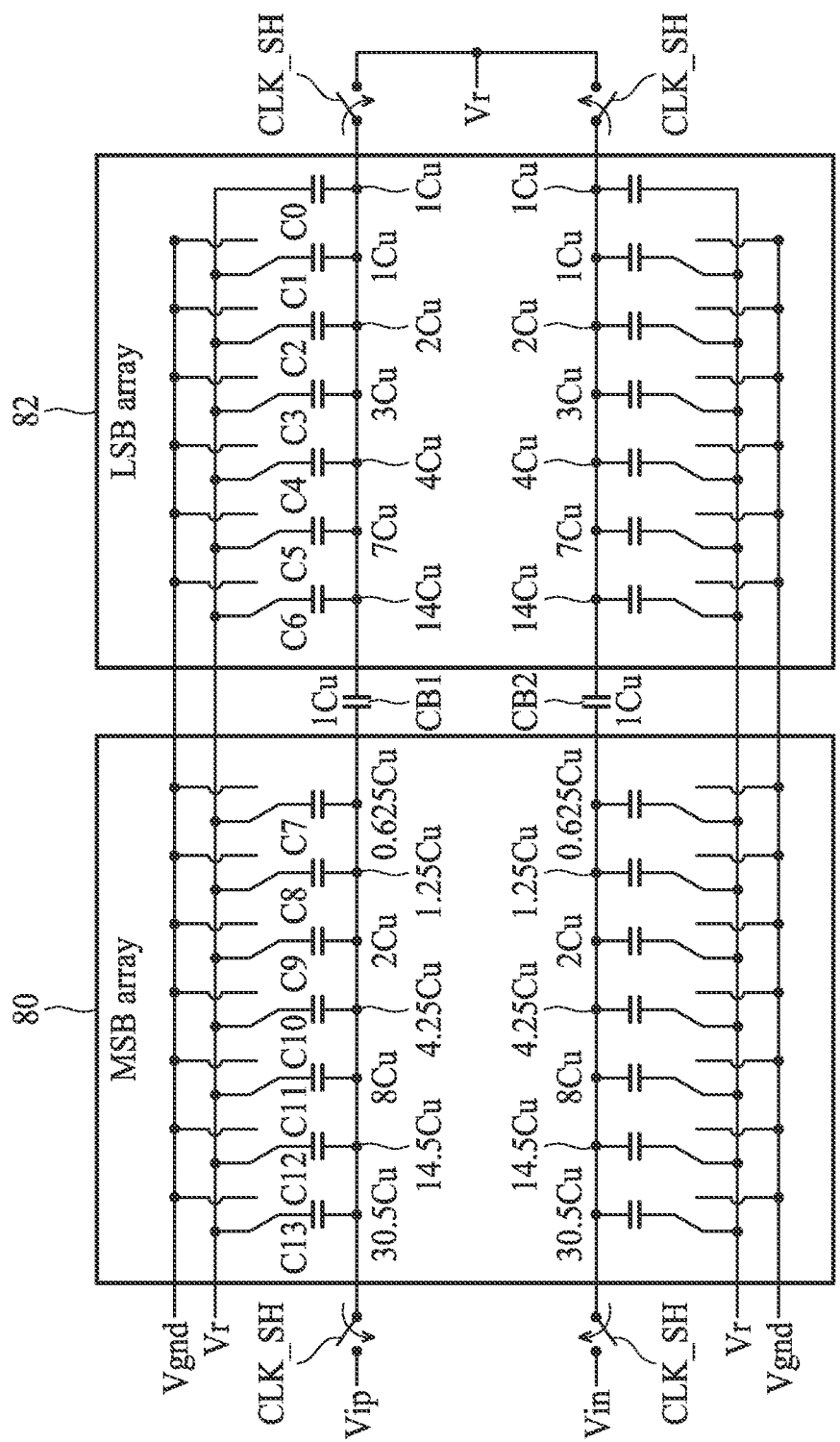
FIG. 8 is a schematic circuit diagram of a CDAC 8 in a SAR ADC 8 according to another embodiment of the invention.

FIG. 8 is a schematic circuit diagram of an S/H and CDAC 8 in a SAR ADC 8 according to another embodiment of the invention, adopting a split non-binary capacitor array including a 7-bit MSB array 80, a 7-bit LSB array 82, bridge capacitors CB1 and CB2, and sampling switches CLK_SH. The bridge capacitors CB1 and CB2 are unit capacitors. The S/H and CDAC 8 may be employed in place of the S/H and CDAC 42 of the SAR ADC 4 in FIG. 4.

The split capacitor array architecture is used to reduce the area of capacitors required for the high-resolution DAC 8. The LSB array 82 is a well-matched capacitor array, while the MSB array 80 is less well-matched. Therefore, only the MSB array 80 requires a weight calibration. The calibration procedure can be any embodiment described in FIG. 2, FIG. 4, FIG. 7 and FIG. 8, or a combination thereof.

Figure 9:
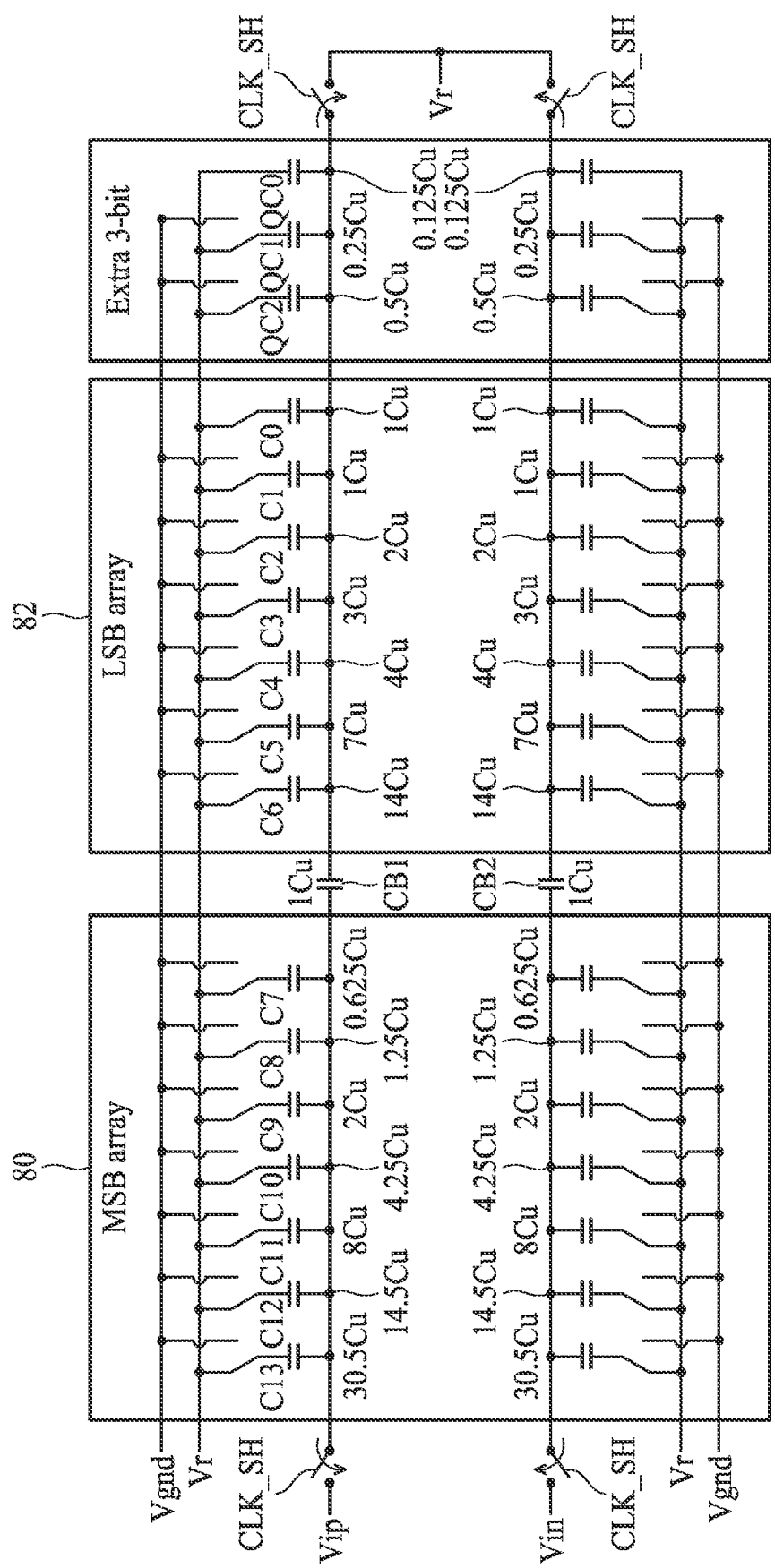
FIG. 9 is a schematic circuit diagram of a CDAC 9 in a SAR ADC 9 according to another embodiment of the invention.

FIG. 9 is a schematic circuit diagram of a CDAC 9 in a SAR ADC 9 according to another embodiment of the invention. The SAR ADC 9 is a split non-binary capacitor array adopting the quantization bits described in FIG. 7. The quantization bits can increase the data convergence speed in the calibration.

FIG. 10 is a signal diagram of a sampling clock CKsamp and compare clock CKcomp for use in a noise reduction procedure 10 according to an embodiment of the invention, incorporating the SAR ADCs in FIGS. 1, 2, and 4. The noise reduction method 10 can reduce or remove a comparator noise in the comparator of the SAR ADC. For the purpose of explanation, the SAR ADC 1 will be used to explain the operations of the noise reduction procedure 10.

Accordingly, the SAR ADC 1 operates alternately in a sampling phase Psamp and conversion phase Pconv according to the sampling clock CKsamp, and performs the sampling and conversion according to the compare clock CKcomp. The sampling clock CKsamp contains sampling periods Sample[n] and conversion periods Conversion[n], where n is a positive integer. The control circuit 162 controls the S/H and DAC 12, comparator 14 and the SAR 160 to perform the noise reduction procedure 10. The S/H and CDAC 12 may contain a separate Sample-and-Hold circuit 120 and CDAC 122.

In the first sampling period Sample[0], the S/H circuit 120 is configured to sample the analog input signals Vip/Vin to generate a first sampled value. In the first conversion periods Conversion[0], the CDAC 122 is configured to generate a number of reference voltage levels successively and then the comparator 14 is configured to compare the first sampled value with the reference voltage levels according to the compare clock CKcomp. In the embodiment, the comparator 14 operates at the rising edges and the CDAC 122 operates at the falling edge of the compare clock CKcomp. After a certain number of clock cycles of the compare clock CKcomp, e.g., 15 clock cycles, the first sampled value is converted into a first n-bit digital code. The first digital code may be a 14-bit digital code, which is stored in the SAR 160 after the conversion. The control circuit 162 is further configured to store the first sampled value in a local memory cell or in the SAR 160.

In the second sampling period Sample[1], the S/H circuit 120 is configured to sample the analog input signals Vip/Vin to generate a second sampled value. Concurrently, the CDAC 122 is configured to generates a reference voltage level for a kth CDAC bit and the comparator 14 is configured to restore the first sampled value from the local memory cell or the SAR 160 and compare the first sampled value with the reference voltage level for a number of times, e.g., 2 times to regenerate the kth bit of the n-bits digital code for several times in the noise reduction period NR[0], wherein k ranges from 0 to (n−1).

After the second sampling period Sample[1] is completed, the control circuit 18 can determine the kth bit of the digital output data Dout[n:0] based on the kth bit in the first digital code and the regenerated kth bits. In one embodiment, the control circuit 18 determines the majority of the kth bit in the first digital code and the regenerated kth bits as the kth bit of the digital output data Dout[n:0]. The number of the bit regenerations may be an even number of times, e,g, 2 times. For example, when the kth bit in the first digital code is Binary '1', and two regenerated kth bits are Binary '0' and Binary '1', respectively, the control circuit 18 will determine Binary '1' is the majority among the 3 candidate data, and subsequently determine the kth bit Dout[k] as Binary '1'. Concurrently in the second conversion periods Conversion[1], the CDAC 122 is configured to generate a number of reference voltage levels successively and then the comparator 14 is configured to compare the second sampled value with the reference voltage levels according to the compare clock CKcomp.

Although the embodiments in FIGS. 4 and 6-10 employ a top-plate sampling, monotonic capacitor switching, binary search type of SAR ADC to illustrate the operations of the CDAC weight calibration procedure, those skilled in the art can modify the present teaching to be adopted by other SAR ADC embodiments.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The term "or" used herein is intended to mean an inclusive "or" rather than an exclusive "or." That is, unless specified otherwise, or clear from the context, the phrase "X employs A or B" is intended to mean any of the natural inclusive permutations. In addition, the articles "a" and "an" as used in this application and the appended claims should generally be construed to mean "one or more" unless specified otherwise or clear from the context to be directed to a singular form.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital-converter (ADC), comprising:
a first capacitive digital-to-analog-converter (CDAC), comprising n capacitors corresponding to n bits, the CDAC being configured to connect a kth bit of the n bits to a first voltage reference to provide a first analog signal, convert the first analog signal into first digital code using 0th through (k−1)th bits that are less significant than the kth bit, connect the kth bit of the n bits to a second voltage reference to provide a second analog signal, and convert the second analog signal into second digital code using the 0th through (k−1)th bits that are less significant than the kth bit, wherein k is an integer ranging from 1 to n; and
a control circuit, configured to estimate a weight of the kth bit based on the first and second digital code, the control circuit further configured to perform calibration of the CDAC capacitors based on the estimated weight.

2. The ADC of claim 1, wherein:
the first CDAC is further configured to sample an analog input, and convert the sampled analog input to an n-bit digital output; and
the control circuit is further configured to calibrate the kth bit of the n-bit digital output based on the estimated weight of the kth bit.

3. The ADC of claim 1, wherein the control circuit is further configured to inject a small-signal noise into the first and second analog signals; and
the small-signal noise has a mean substantially equaling 0.

4. The ADC of claim 1, wherein:
the first CDAC further comprises quantization bits, having a resolution less than that of the n bits, configured to estimate a first quantization error of the first analog signal, and estimate a second quantization error of the second analog signal using the quantization bits; and
the control circuit is configured to estimate the weight of the kth bit based on the first and second digital code and the first and second quantization errors.

5. The ADC of claim 1, wherein the kth bit has a first weight that is less than a sum of weights of the 0th through (k−1)th bits.

6. The ADC of claim 1, wherein the control circuit is configured to determine a difference of first and second digital code to represent the weight of the kth bit.

7. The ADC of claim 1, further comprises
a bridge capacitor, coupled to the first CDAC; and
a second CDAC, coupled to the bridge capacitor, comprising m bits, wherein an ith bit of the m bits has a second weight that is less than a sum of weights of the 0th through (i−1)th bits.

8. An analog-to-digital-converter (ADC), comprising:
a first capacitive digital-to-analog-converter (DAC), comprising n capacitors corresponding to n bits, the CDAC being configured to connect a kth bit of the n bits to a first voltage reference to provide a first analog signal, inject a first small-signal noise into the first analog signals, and convert the injected first analog signal into first digital code using 0th through (k−1)th bits that are less significant than the kth bit, wherein k is an integer ranging from 1 to n; and
a control circuit, configured to estimate a weight of the kth bit based on the first digital code, the control circuit further configured to perform calibration of the CDAC capacitors based on the estimated weight.

9. The ADC of claim 8, wherein the small-signal noise has a mean substantially equaling 0.

10. The ADC of claim 8, wherein:
the first CDAC is further configured to connect the kth bit of the n bits to a second voltage reference to provide a second analog signal, inject a second small-signal noise into the second analog signals, and convert the injected second analog signal into second digital code using 0th through (k−1)th bits that are less significant than the kth bit; and
the control circuit, configured to estimate the weight of the kth bit based on the first and second digital code.

11. The ADC of claim 8, wherein the control circuit is configured to determine a difference of first and second digital code to represent the weight of the kth bit.

12. The ADC of claim 11, wherein the control circuit is configured to determine a difference of first and second digital code to represent the weight of the kth bit.

13. The ADC of claim 8, wherein:
the first CDAC further comprises quantization bits, having a resolution less than that of the n bits, configured to estimate a first quantization error of the first analog signal, and estimate a second quantization error of the second analog signal using the quantization bits; and
the control circuit is configured to estimate the weight of the kth bit based on the first and second digital code and the first and second quantization errors.

14. The ADC of claim 8, wherein:
the first CDAC is further configured to sample an analog input, and convert the sampled analog input to an n-bit digital output; and
the control circuit is further configured to calibrate the kth bit of the n-bit digital output based on the estimated weight of the kth bit.

15. The ADC of claim 8, wherein the kth bit has a first weight that is less than a sum of weights of the 0th through (k−1)th bits.

16. The ADC of claim 8, further comprises
a bridge capacitor, coupled to the first CDAC; and
a second CDAC, coupled to the bridge capacitor, comprising m bits, wherein an ith bit of the m bits has a second weight that is less than a sum of weights of the 0th through (i−1)th bits.

17. An analog-to-digital-converter, receiving an analog input signal and outputting digital output data, comprising:
- a clock generator, configured to generate a sampling clock with a sampling period and a conversion period;
- a sample and hold circuit, configured to sample the analog input signal in a first sampling period to generate a first sampled value, and sample the analog input signal in a subsequent second sampling period to generate a second sampled value;
- a storage circuit, configured to hold the first sampled value in the subsequent second sampling period;
- a capacitive digital-to-analog-converter (CDAC) and a comparator, configured to convert the first sampled value into first n-bits digital code in a first conversion period, and perform an analog-to-digital conversion to the first sampled value to regenerate a kth bit of n-bits digital code for a plurality of times in a subsequent second sampling period, the CDAC comprising a plurality of capacitors; and
- a control circuit configured to determine a kth bit of the digital output data based on the kth bit in the first digital code and the regenerated kth bits, the control circuit being further configured to calibrate the capacitors.

18. The analog-to-digital-converter of claim 17, wherein control circuit is configured to determine a majority of the kth bit in the first digital code and the regenerated kth bits as the kth bit of the digital output data.

19. The analog-to-digital-converter of claim 17, wherein the plurality of times are an even number of times.

\* \* \* \* \*